United States Patent
Yamagishi et al.

(10) Patent No.: US 7,045,582 B2
(45) Date of Patent: May 16, 2006

(54) PREPARATION PROCESS OF COPOLYMER FOR SEMICONDUCTOR LITHOGRAPHY AND A COPOLYMER FOR SEMICONDUCTOR LITHOGRAPHY AVAILABLE BY THIS PROCESS

(75) Inventors: Takanori Yamagishi, Funabashi (JP); Kazuhiko Mizuno, Sodegaura (JP); Tomo Oikawa, Ichihara (JP); Ichiro Kato, Chiba (JP)

(73) Assignee: Maruzen Petrochemical Co. Ltd., Tokyo (JP)

( * ) Notice: Subject to any disclaimer, the term of this patent is extended or adjusted under 35 U.S.C. 154(b) by 0 days.

(21) Appl. No.: 11/005,914

(22) Filed: Dec. 6, 2004

(65) Prior Publication Data

US 2005/0131184 A1    Jun. 16, 2005

(30) Foreign Application Priority Data

Dec. 11, 2003    (JP)    ............................. 2003-413438

(51) Int. Cl.
*C08F 2/38*    (2006.01)
(52) U.S. Cl. ............................. 526/82; 526/83; 526/84; 526/85
(58) Field of Classification Search ................. 526/82, 526/83, 84, 85
See application file for complete search history.

(56) References Cited

U.S. PATENT DOCUMENTS

| | | | | |
|---|---|---|---|---|
| 2,993,789 | A | * | 7/1961 | Crawford ................. 430/281.1 |
| 5,544,773 | A | * | 8/1996 | Haruta et al. .................. 216/13 |
| 6,639,084 | B1 | * | 10/2003 | Maeda et al. ................ 549/266 |
| 6,710,188 | B1 | * | 3/2004 | Maeda et al. ................ 549/266 |
| 2001/0026901 | A1 | * | 10/2001 | Maeda et al. ............. 430/270.1 |
| 2001/0044070 | A1 | * | 11/2001 | Uetani et al. ............. 430/270.1 |
| 2003/0224297 | A1 | * | 12/2003 | Maeda et al. ................ 430/311 |
| 2004/0063882 | A1 | * | 4/2004 | Kamon et al. .............. 526/266 |

FOREIGN PATENT DOCUMENTS

| | | | |
|---|---|---|---|
| EP | 1 352904 | * | 10/2003 |
| JP | 2001-81139 | * | 3/2001 |
| JP | 2002275215 | * | 9/2002 |
| JP | 2003-140346 | * | 5/2003 |

* cited by examiner

*Primary Examiner*—Bernard Lipman
(74) *Attorney, Agent, or Firm*—Melvin I. Stoltz

(57) ABSTRACT

Provided are a preparation process of a copolymer for semiconductor lithography, suited for a film forming composition used for the formation of minute patterns necessary for semiconductor fabrication, which comprises carrying out radical polymerization of at least two monomers having an ethylenic double bond in the presence of a polymerization initiator in a polymerization solvent, while causing to exist, in the solution containing the monomers, a polymerization inhibitive component; and a copolymer for semiconductor lithography prepared by the above-described process, and contains no high polymer, has excellent storage stability and generates remarkably less defects in resist pattern when used for semiconductor lithography.

11 Claims, No Drawings

PREPARATION PROCESS OF COPOLYMER FOR SEMICONDUCTOR LITHOGRAPHY AND A COPOLYMER FOR SEMICONDUCTOR LITHOGRAPHY AVAILABLE BY THIS PROCESS

BACKGROUND OF THE INVENTION

1. Field of the Invention

The present invention relates to a preparation process of a copolymer suited for use as a film forming polymer such as resist polymer, polymer used for an antireflective film and polymer used for a bottom film of a multilayer resist; and a copolymer for semiconductor lithography available by this process. In particular, the invention pertains to a preparation process of a copolymer for semiconductor lithography which does not contain a high molecular weight component having a molecular weight of 100,000 or greater (high polymer) and generates far fewer defects in resist patterns; and a copolymer for semiconductor lithography available by this process.

2. Background Art

In lithography for the fabrication of semiconductors, the formation of finer patterns has been requested with an increase in the degree of integration. For the formation of finer patterns, the shortening in the wavelength of an exposure light source is indispensable. Lithography with a krypton fluoride (KrF) excimer laser light (wavelength: 248 nm) is becoming mainstream now, while lithography with an argon fluoride (ArF) excimer laser light (wavelength: 193 nm) which can attain a line width of 100 nm or less will be industrialized in near future. A variety of lithographic technologies using radiation of a short wavelength such as a fluorine dimer ($F_2$) excimer laser light (wavelength: 157 nm), extra ultra-violet radiation (EUV), X ray and electron beam are under development.

In such semiconductor lithography, various coating films such as resist film for the formation of patterns to be transferred to a substrate by utilizing a solubility change of a resist polymer in an alkaline developing solution caused by the action of an acid to the resist polymer, or films lying below or over the resist film are formed. Examples of the underlying film include an antireflective film for forming fine resist patterns precisely while suppressing a reflected light from a substrate; a flattening film to be used as an underlying film of a resist film, upon formation of a resist pattern over the substrate already having a pattern thereover, in order to flatten the surface of the substrate; and a bottom film of a multilayer resist to which a resist pattern is transferred by dry etching.

These coating films such as resist film are each formed by dissolving a copolymer for lithography having a function appropriate for each coating film and other additives in an organic solvent to prepare a coating solution, and applying the resulting solution to a substrate by spin coating method or the like, and removing the solvent by optional heating. The copolymer for lithography is required to have basic properties as a copolymer for coating film such as no inclusion of foreign matters disturbing the formation of fine patterns, as well as optical properties, chemical properties, coating properties and physical properties such as adhesion to a substrate or underlying film, all necessary for a resist film or antireflective film.

Resist polymers used for a resist film can be classified into a negative type whose solubility in an alkaline developing solution lowers by the action of an acid and a positive type whose solubility in an alkaline developing solution heightens by the action of an acid. Positive type resist polymers have, as essential components, a recurring unit having a structure in which a non-polar substituent is decomposed by an acid and a polar group soluble in an alkaline developing solution appears and another recurring unit having a polar group for heightening adhesion to a semiconductor substrate, and optionally a further recurring unit having a polar or non-polar substituent for regulating the solubility in a resist solvent or alkaline developing solution. As the recurring unit having a polar group for imparting the resist polymer with adhesion to a substrate, hydroxystyrenes are mainly used when a KrF excimer laser is used as an exposure light source. When an ArF excimer laser light is used as an exposure light source, use of polar-group-containing (meth)acrylates instead of hydroxystyrenes is investigated, because the latter ones absorb light having a wavelength of 193 nm.

As such a positive resist polymer for KrF system, known are copolymers using a (meth)acrylic acid type monomer and a styrene type monomer in combination (refer to, for example, Japanese Patent Laid-Open Nos. 45439/1984, 113667/1993, 209868/1995, and 65120/1999) and polymers having a hydroxystyrene protected, at a portion thereof, with acetal (refer to, for example, Japanese Patent Laid-Open Nos. 115440/1987, 219757/1992, 223860/1991 and 104251/1929), while as that for ArF system, known are co-polymers of a (meth)acrylic acid type monomer having a lactone structure (refer to, for example, Japanese Patent Laid-Open Nos. 73173/1997 and 239846/1998).

As the polymer used for an antireflective film, known are polymers obtained by copolymerizing an aromatic-nucleus-containing vinyl compound such as styrene, styrene derivative or anthracenylmethyl (meth)acrylate and an acrylamide derivative or a hydroxyl- or epoxy-containing vinyl compound, and optionally an alkyl (meth)acrylate (refer to, for example, Japanese Patent Laid-Open Nos. 313779/2000, 27810/2001, 192411/2001 and 226324/2001). As the polymer used for a flattening film, known are copolymers between a hydroxystyrene and a monomer such as styrene, alkyl (meth)acrylate or hydroxyalkyl (meth)acrylate (refer to, for example, Japanese Patent Laid-Open No. 57828/2003).

As resist patterns are becoming finer, more minute defects of resist patterns become a target of control and requirements for the performances of the above-described film forming polymers for semiconductor lithography become severe. Defects of resist patterns occur owing to the existence of foreign matters in the resist composition. Foreign matters in a resist solution were conventionally removed by using a filter of a micropore size or a filter having a zeta potential (refer to, for example, Japanese Patent Laid-Open Nos. 307263/1993 and 2001-350266) and foreign matters (contaminants) such as dust existing in the circumstance could be removed completely. Extremely minute, sparingly soluble substances however could not be completely removed by filtration and have been a great hindrance to the miniaturization of patterns formed by semiconductor lithography.

As a result of the investigation by the present inventors, it has been found that a trace amount of a high molecular weight component having a molecular weight of 100,000 or greater (which may hereinafter be called "high polymer"), as one of the extremely minute, sparingly soluble substances, has a serious influence on the formation of resist patterns. Described specifically, the solubility of a polymer generally depends on its molecular weight. High polymer molecules are sparingly soluble in a resist solvent or aqueous alkali.

Even if it seems to be dissolved in the solvent or aqueous alkali, it is presumed to be a cause for defects when fine patterns are formed by lithography. In addition, when a high polymer exists, insoluble foreign matters (liquid-borne particles) grow with the high polymer as a nucleus with the passage of time during the storage of the resist solution and they appear as precipitates. There is therefore a high possibility of insoluble foreign matters being a cause for defects of resist patterns. There is accordingly an eager demand for the provision of a copolymer for semiconductor lithography in which an increase in liquid-borne particles is small during its storage period; and a preparation process of the copolymer.

In general, a film forming polymer for semiconductor lithography such as resist polymer can be prepared by radical solution polymerization of a raw material monomer. When a trace amount of a radical is generated before the temperature reaches the polymerization temperature, a radical concentration lower than the monomer concentration induces formation of a high polymer owing to the relationship as indicated by the below-described equation (1) and this is presumed to have serious influences as described above on the formation of resist patterns.

$$P_n \propto [M]/[R \cdot] \quad (1)$$

wherein, $P_n$ represents the molecular weight of a polymer prepared, [M] represents a monomer concentration and [R·] represents a radical concentration.

In the case of so-called bulk polymerization in which polymerization is carried out after dissolving a monomer and a polymerization initiator in a solvent and then heating the resulting solution to a polymerization temperature, a high polymer tends to be formed during the retention time prior to heating or during the time until the temperature of the solution reaches the polymerization temperature owing to a radical concentration lower than the monomer concentration. A method of dissolving a monomer in a polymerization solvent and after the temperature reaches polymerization temperature by heating, adding a polymerization initiator to the resulting solution (refer to, for example, Japanese Patent Laid-Open No. 109153/2001) is known. This method is however accompanied with the drawback that during heating of the solution containing only the monomer, a high polymer tends to be formed owing to a radical generated in a trace amount due to impurities in the monomer solution. The so-called dropping polymerization method (refer to, for example, Japanese Patent Laid-Open Nos. 269754/1992 (Examples), 39444/1993 (Examples), 247386/1993 (Examples), 311110/1993 (Examples), 231538/1999 and International Patent Publication No. 99/50322) in which polymerization is effected by the dropwise addition of a solution, which has been obtained by dissolving a monomer and a polymerization initiator in a solvent, to a solvent heated to a polymerization temperature is known. Even this method is however accompanied with the drawback that a high polymer is formed owing to a trace amount of a radical generated during the retention time starting from mixing of the monomer with the polymerization initiator until the dropwise addition.

In radical polymerization reaction, by deaeration of a solvent or purification of a monomer, a radical trapping substance such as oxygen or polymerization inhibitor is often removed in advance before polymerization (refer to, for example, Japanese Patent Laid-Open No. 2003-221403).

The investigation by the present inventors however has revealed that such an operation is causative of the generation of a high polymer.

SUMMARY OF THE INVENTION

The present invention has been made in light of the foregoing prior art technique and an object of the same is to provide a preparation process of a copolymer for semiconductor lithography suitably used for a film forming composition such as a resist film forming composition used for the formation of fine patterns necessary for semiconductor fabrication, a bottom film forming composition of a multilayer resist and an antireflective film forming composition; and a copolymer which is available by the above-described process, does not contain a high polymer, has excellent storage stability and generates far fewer defects in resist patterns when used for semiconductor lithography.

The present inventors have carried out an extensive investigation with a view to overcoming the above-described problems. As a result, it has been found that upon preparation of a copolymer for semiconductor lithography by radical polymerization, generation of a high polymer can be suppressed by carrying out radical polymerization, against the technical common sense, in the presence of a polymerization inhibitive component in a monomer-containing solution, leading to the completion of the present invention.

In the present invention, there are thus provided a preparation process of a copolymer for semiconductor lithography which comprises carrying out radical polymerization of at least two monomers having an ethylenic double bond in a polymerization solvent in the presence of a polymerization initiator, while causing to exist, in the monomer-containing solution, a polymerization inhibitor in an amount of 20 mol ppm or greater or oxygen in an amount of 400 mol ppm or greater as a polymerization inhibitive component, each based on the monomers; and a copolymer for semiconductor lithography prepared by the process.

According to the present invention, it is possible to prepare a high-polymer-free copolymer for semiconductor lithography, because a trace amount of radicals generated particularly at a temperature lower than the polymerization temperature can be trapped by the polymerization inhibitive component caused to exist in the monomer-containing solution. In addition, since the copolymer available by the invention process does not generate a high polymer and insoluble foreign matters resulting therefrom, generation of liquid-borne particles is small even after passage of time during storage. When the copolymer is used for semiconductor lithography, it is therefore expected to generate less resist defects in resist patterns.

DETAILED DESCRIPTION OF THE INVENTION

As a raw material monomer to be used for the radical copolymerization to prepare a copolymer for semiconductor lithography, any monomer can be used without particular limitation insofar as it is a monomer having an ethylenic double bond and generally used for the preparation of a resist polymer, a bottom film polymer of a multilayer resist or an antireflective film polymer. In consideration of resolution and transparency of the resulting copolymer for semiconductor lithography, the monomer preferably contains at least one of acrylate ester type monomers and/or methacrylate ester type monomers.

When the copolymer obtained by the present invention is used as a positive resist polymer, the copolymer has at least a recurring unit having a structure which is decomposed by an acid to become soluble in an alkaline developing solution. More specifically, it has, as essential components, (A) a recurring unit having a structure permitting appearance of a polar group soluble in an alkaline developing solution by the decomposition of a non-polar substituent by an acid; (B) a recurring unit having a polar group for enhancing the adhesion to a semiconductor substrate; and optionally (C) a recurring unit having a non-polar substituent for regulating the solubility in a resist solvent or alkaline developing solution.

The structure of the recurring unit (A) which is decomposed by an acid to become alkali soluble is ordinarily employed in a resist and can be obtained by polymerizing a monomer having a structure which is decomposed by an acid to become alkali soluble, or by polymerizing a monomer having an alkali soluble structure and protecting a substituent, in the alkali soluble structure, having an alkali soluble group (which will hereinafter be called "alkali soluble substituent") with a protecting group which is insoluble in an alkali and is dissociated by an acid (which will hereinafter be called "acid dissociative protecting group").

As the monomer having a structure which is decomposed by an acid to become alkali soluble, compounds obtained by binding an acid-dissociative protecting group to a monomer containing an alkali soluble substituent can be given. They are, for example, compounds having a phenolic hydroxyl group, carboxyl group or hydroxyfluoroalkyl group protected with a non-polar acid-dissociative protecting group.

Examples of such a monomer include hydroxystyrenes such as p-hydroxystyrene, m-hydroxystyrene and p-hydroxy-α-methylstyrene; carboxylic acids having an ethylenic double bond such as acrylic acid, methacrylic acid, maleic acid, fumaric acid, α-trifluoromethylacrylic acid, 5-norbornene-2-carboxylic acid, 2-trifluoromethyl-5-norbornene-2-carboxylic acid and carboxytetracyclo[4.4.0.1$^{2,5}$.1$^{7,10}$]dodecyl methacrylate; and monomers having a hydroxyfluoroalkyl group such as p-(2-hydroxy-1,1,1,3,3,3-hexafluoro-2-propyl)styrene, 2-(4-(2-hydroxy-1,1,1,3,3,3-hexafluoro-2-propyl)cyclohexyl)-1,1,1,3,3,3-hexafluoropropyl acrylate, 2-(4-(2-hydroxy-1,1,1,3,3,3-hexafluoro-2-propyl)cyclohexyl)-1,1,1,3,3,3-hexafluoropropyl trifluoromethylacrylate and 5-(2-hydroxy-1,1,1,3,3,3-hexafluoro-2-propyl)methyl-2-norbornene and the like.

Examples of the acid-dissociative protecting group include saturated hydrocarbon groups such as tert-butyl group, tert-amyl group, 1-methyl-1-cyclopentyl group, 1-ethyl-1-cyclopentyl group, 1-methyl-1-cyclohexyl group, 1-ethyl-1-cyclohexyl group, 2-methyl-2-adamantyl group, 2-ethyl-2-adamantyl group, 2-propyl-2-adamantyl group, 2-(1-adamantyl)-2-propyl group, 8-methyl-8-tricyclo[5.2.1.0$^{2,6}$]decanyl group, 8-ethyl-8-tricyclo[5.2.1.0$^{2,6}$]decanyl group, 8-methyl-8-tetracyclo[4.4.0.1$^{2,5}$.1$^{7,10}$]dodecanyl group and 8-ethyl-8-tetracyclo[4.4.0.1$^{2,5}$.1$^{7,10}$]dodecanyl group; and oxygen-containing hydrocarbon groups such as 1-methoxyethyl group, 2-ethoxyethyl group, 1-iso-propoxyethyl group, 1-n-butoxyethyl group, 1-tert-butoxyethyl group, 1-cyclopentyloxyethyl group, 1-cyclohexyloxyethyl group, 1-tricyclo[5.2.1.0$^{2,6}$]decanyloxyethyl group, 1-methoxymethyl group, 2-ethoxymethyl group, 1-iso-propoxymethyl group, 1-n-butoxymethyl group, 1-tert-butoxymethyl group, 1-cyclopentyloxymethyl group, 1-cyclohexyloxymethyl group, 1-tricyclo[5.2.1.0$^{2,6}$]decanyloxymethyl group and tert-butoxycarbonyl group and the like.

Of these acid-dissociative protecting groups, those having an alicyclic structure are preferred, because the resist polymer available by using them has high etching resistance and a difference in the solubility in an alkaline developing solution between the presence and absence of the acid-dissociative protecting group becomes large. Specific examples of the alicyclic structure include those having from 5 to 20 carbon atoms such as cyclopentane, cyclohexane, isobornane, norbornane, adamantane, tricyclo[5.2.1.0$^{2,6}$] and tetracyclo[4.4.0.1$^{2,5}$.1$^{7,10}$]dodecane rings.

When after the polymerization of a monomer having an alkali soluble structure, an alkali soluble substituent in the alkali soluble structure is protected with an acid-dissociative protecting group, the compound having an alkali soluble group is used as is for the polymerization reaction, followed by the reaction, in the presence of an acid catalyst, with a compound capable of providing an alkali-insoluble substituent such as vinyl ether or halogenated alkyl ether, whereby the acid-dissociative protecting group can be introduced into the polymer. Examples of the acid catalyst used for the reaction include p-toluenesulfonic acid, trifluoroacetic acid, and strongly acidic ion exchange resin.

As the monomer which gives the recurring unit (B) having a polar group for enhancing the adhesion to a semiconductor substrate, compounds having a phenolic hydroxyl group, carboxyl group or hydroxyfluoroalkyl group as a polar group can be given. Specific examples include the hydroxystyrenes, carboxylic acids having an ethylenic double bond, and monomers having a hydroxyfluoroalkyl group which are described above as the monomer containing an alkali soluble group; these monomers substituted further with a polar group; and monomers having an alicyclic structure, such as norbornene ring or tetracyclododecene ring, to which a polar group has been bonded.

As the above-described polar group to be introduced into the recurring unit (B) as a substituent, particularly preferred are substituents having a lactone structure. Examples include substituents having a lactone structure such as γ-butyrolactone, γ-valerolactone, δ-valerolactone, 1,3-cyclohexanecarbolactone, 2,6-norbornanecarbolactone, 4-oxatricyclo[5.2.1.0$^{2,6}$]decan-3-one and mevalonic acid δ-lactone. Examples of the polar group having a structure other than the lactone structure include hydroxyalkyl groups such as hydroxymethyl, hydroxyethyl, hydroxypropyl and 3-hydroxy-1-adamantyl.

Examples of the monomer giving the recurring unit (C) which is an optional component of the copolymer and having a non-polar substituent for regulating the solubility in a resist solvent or alkali developing solution include aromatic compounds having an ethylenic double bond such as styrene, α-methylstyrene, p-methylstyrene and indene; ester compounds having an ethylenic-double-bond-containing carboxylic acid such as acrylic acid, methacrylic acid, trifluoromethylacrylic acid, norbornene-carboxylic acid, 2-trifluoromethylnorbornenecarboxylic acid and carboxytetracyclo[4.4.0.1$^{2,5}$.1$^{7,10}$]dodecyl methacrylate, substituted with an acid stable non-polar group; and alicyclic hydrocarbon compounds having an ethylenic double bond such as norbornene and tetracyclododecene. Examples of the acid-stable non-polar substituents with which the carboxylic acid has been ester-substituted include methyl group, ethyl group, cyclopentyl group, cyclohexyl group, isobornyl group, tricyclo[5.2.1.0$^{2,6}$]decanyl group, 2-adamantyl group and tetracyclo[4.4.0.1$^{2,5}$.1$^{7,10}$]dodecyl group.

In each of the recurring units (A), (B) and (C), these monomers can be used either singly or in combination of two or more. The composition ratio of these recurring units in the resist polymer thus obtained can be selected within a range not impairing the basic performance of the resist. Described specifically, the composition ratio of the recurring unit (A) is preferably from 10 to 70 mol %, more preferably from 10 to 60 mol %. The composition ratio of the recurring unit (B) is preferably from 30 to 90 mol %, more preferably from 40 to 90 mol %, while the composition ratio of monomer units having the same polar group is preferably 70 mol % or less. The composition ratio of the recurring unit (C) is preferably from 0 to 50 mol %, more preferably from 0 to 40 mol %.

When the copolymer obtained by the present invention is used as a polymer for a bottom film of a multilayer resist or an antireflective film, a polymer obtained by removing, from the structure of the resist polymer, the recurring unit (A) having a structure which is decomposed by an acid to become alkali soluble. Although the composition ratio of the respective recurring units in the copolymer cannot be determined in a wholesale manner because it differs depending on the using purpose of the coating film, the composition ratio of the recurring unit (B) is selected from a range of from 10 to 100 mol %, while the composition ratio of the recurring unit (C) is selected from a range of from 0 to 90 mol %.

When the copolymer obtained by the present invention is used as an antireflective film, it must have a group serving as a crosslinking point and a structure of absorbing radiation emitted upon photolithography. Examples of the group serving as a crosslinking point include reactive substituents which can be crosslinked by ester bond or urethane bond, such as hydroxyl group, amino group, carboxyl group and epoxy group. As the monomer containing a reactive substituent serving as a crosslinking point, hydroxystyrenes such as p-hydroxystyrene and m-hydroxystyrene and monomers obtained by substituting the above-described monomers with the reactive substituent such as hydroxyl group, amino group, carboxyl group or epoxy group can be used as needed.

The structure of absorbing radiation differs depending on the wavelength of the radiation to be employed. For example, a structure containing a benzene ring or analogue thereof is preferably employed for an ArF excimer laser light. Examples of a monomer containing such a structure include styrenes such as styrene, α-methylstyrene, p-methylstyrene, p-hydroxystyrene and m-hydroxystyrene, and derivatives thereof; and aromatic-containing esters having an ethylenic double bond such as substituted or unsubstituted phenyl (meth)acrylate, substituted or unsubstituted naphthalene (meth)acrylate, substituted or unsubstituted anthracene methyl (meth)acrylate. The monomer having a radiation-absorbing structure may be introduced as either one of the recurring unit (B) or (C), depending on the presence or absence of a polar group therein, but the composition ratio of the monomer having a radiation-absorbing structure is preferably selected from a range of from 10 to 100 mole %.

In the present invention, the copolymer for semiconductor lithography is available by radical polymerization of at least two monomers selected from the above-described monomer group in the presence of a polymerization initiator in a polymerization solvent.

Any polymerization initiator can be used for polymerization reaction without particular limitation insofar as it is an ordinarily employed radical generator. Examples include azo compounds such as 2,2'-azobisisobutyronitrile, 2,2'-azobis(2-methylbutyronitrile), dimethyl 2,2'-azobis(isobutyrate), 1,1'-azobis(cyclohexane-1-carbonitrile) and 4,4'-azobis(4-cyanovaleric acid), and organic peroxides such as decanoyl peroxide, lauroyl peroxide, benzoyl peroxide, bis (3,5,5-trimethylhexanoyl) peroxide, succinic acid peroxide and tert-butyl peroxy-2-ethylhexanoate. They can be used either singly or in combination as a mixture.

Use of a chain transfer agent is not particularly required, but it is possible to use, for example, known thiol compounds such as dodecylmercaptane, mercaptoethanol, mercaptopropanol, mercaptoacetic acid, mercaptopropionic acid and 4,4-bis(trifluoromethyl)-4-hydroxy-1-mercaptobutane either singly or in combination.

The amount of each of the polymerization initiator and chain transfer agent differs depending on the preparation conditions such as kind of raw material monomers, polymerization initiator or chain transfer agent used for the polymerization reaction, polymerization temperature, polymerization solvent, polymerization method and purifying conditions and therefore it cannot be determined in a wholesale manner. They are each added in an amount optimum for attaining a desired molecular weight. In general, when the copolymer has a too high weight average molecular weight, its solubility in a solvent used upon film formation or alkali developer lowers. Too low weight average molecular weight, on the other hand, deteriorates the film performance of the copolymer. It is preferred to adjust the weight average molecular weight within a range of from 2,000 to 40,000, more preferably within a range of from 3,000 to 30,000.

As a polymerization method for preparing the copolymer, solution polymerization is preferred. In this case, radical copolymerization is preferably effected while dissolving raw material monomers and polymerization initiator, and if necessary a chain transfer agent in a polymerization solvent. The solution polymerization can be carried out, for example, by any one of so-called batch polymerization method in which all the monomers and the polymerization initiator, and optionally the chain transfer agent are dissolved in a polymerization solvent, followed by heating the resulting solution to a polymerization temperature; initiator addition method in which the polymerization initiator is added after the monomers are dissolved in a solvent and the resulting solution is heated to a polymerization temperature; and dropwise addition polymerization method in which a portion or whole portion of the monomers, polymerization initiator and optionally chain transfer agent is added dropwise, either individually or as a mixture, into a polymerization system heated to a polymerization temperature. The last one is suited, because lot-to-lot difference can be decreased in this method.

In the present invention, it is essential to incorporate a polymerization inhibitive component in the monomer-containing solution which has not yet been heated to the polymerization temperature or the monomer-containing solution which has not yet been added dropwise to the polymerization system heated to the polymerization temperature, such as a solution to be charged in a polymerization tank in the batch polymerization method or a monomer solution to be fed to a polymerization tank in the dropwise addition polymerization method. It is to be noted that the monomer-containing solution may be composed only of the monomers if they are liquid monomers or may contain the monomers and a solvent and if necessary, the polymerization initiator and chain transfer agent.

Compounds ordinarily employed as a polymerization inhibitor or oxygen can be used as the polymerization inhibitive component to be incorporated in the monomer-containing solution in the present invention. Any known polymerization inhibitors can be used as the polymerization inhibitor. Specific examples include hydroquinone and derivatives thereof such as 4-methoxyphenol, tert-butylhydroquinone and 2,5-di-tert-butyl hydroquinone; benzoquinone and derivatives thereof such as methylbenzoquinone and tert-butylbenzoquinone; catechol and derivatives thereof such as 4-tert-butylcatecol; phenothiazine and derivatives thereof; N-nitrosophenylhydroxylamine and derivatives thereof; and 2,2,6,6-tetramethylpiperidin-1-oxyl free radical and derivatives thereof. These polymerization inhibitors may be used either singly or as a mixture.

The amount of the polymerization initiator to be incorporated in the monomer-containing solution is preferably 20 mol ppm or greater based on the monomers, because too small amount is not effective for trapping a radical. When the monomer-containing solution also contains the polymerization initiator, the polymerization inhibitor is added preferably in an amount of 0.1 mol % or greater based on the amount of the polymerization initiator. No particular limitation is imposed on the upper limit of the amount of the polymerization inhibitor, however, an excessive amount retards the polymerization reaction. In addition, the polymerization inhibitor remains even after purification and it absorbs radiation used for lithography, though depending on its kind. The polymerization inhibitor is therefore added in an amount of 5,000 mol ppm or less, more preferably 3,000 mol ppm based on the monomers. When the monomer-containing solution also contains the polymerization initiator, the polymerization inhibitor is added preferably in an amount of 20 mol % or less, more preferably 10 mol % or less, based on the polymerization initiator.

Oxygen is also usable as the polymerization inhibitive component of the present invention, because it has a radical trapping capacity. Since its radical trapping effect is lower than that of the above-described polymerization inhibitor, a relatively large amount of oxygen must be added in order to attain the object of the present invention only by oxygen without using the polymerization inhibitor. In this case, an amount of oxygen dissolved in the monomer solution is preferably 400 mol ppm or greater based on the monomer. When the monomer-containing solution contains the polymerization initiator, the amount is preferably 2 mol % or greater based on the polymerization initiator.

In order to cause oxygen of the above-described concentration to exist with the monomers, the monomer-containing solution is retained in an oxygen or air atmosphere or oxygen or air is bubbled into the solution. Alternatively, a solvent retained in an oxygen or air atmosphere or a solvent having oxygen or air bubbled therein may be employed for the preparation of the monomer-containing solution.

It is however not preferred to incorporate an excessive amount of oxygen in the monomer-containing solution, because polymerization under an oxygen atmosphere is not always safe, and the copolymer available under such a condition cannot easily have a stable quality because the concentration of oxygen dissolved in the polymerization system changes by heating. The amount of oxygen dissolved in the polymerization system is preferably 10,000 mol ppm (1 mole %) or less based on the monomers, and in the presence of a polymerization initiator, the amount is 50 mole % or less based on the polymerization initiator. With regards to a gas zone in the polymerization system, an oxygen concentration in the gas zone is controlled not to exceed the explosion limit by purging with an inert gas such as nitrogen prior to introduction of the monomer-containing solution or prior to the heating to the polymerization temperature.

As a solvent to be used for the monomer-containing solution and/or polymerization reaction, any solvent can be used without particular limitation insofar it can stably dissolve therein raw material monomers, the resulting copolymer, polymerization initiator and chain transfer agent. Specific examples of a preferred solvent include ketones such as acetone, methyl ethyl ketone, methyl amyl ketone and cyclohexanone; ethers such as tetrahydrofuran, dioxane, glyme, and propylene glycol monomethyl ether; esters such as ethyl acetate and ethyl lactate; ether esters such as propylene glycol methyl ether acetate; and lactones such as γ-butyrolactone. They can be used either singly or as a mixture.

Although there is no particular limitation imposed on the amount of the polymerization solvent, it is usually added in an amount of from 0.5 to 20 parts by weight, preferably from 1 to 10 parts by weight based on 1 part by weight of the monomers. When the amount of the solvent is too small, the polymerization system cannot be maintained uniformly because of the precipitation of the monomers or excessive viscosity rise. When the amount is too large, on the other hand, a conversion ratio of the monomers may be insufficient or the molecular weight of the copolymer cannot always be heightened to a desired value.

The temperature upon preparation of the monomer-containing solution or the temperature at which the monomer-containing solution is retained before heating or dropwise addition must be a temperature at which the monomers are dissolved in the solvent and which does not cause decomposition or precipitation of the monomers and the polymerization initiator or chain transfer agent when the polymerization initiator or chain transfer agent is caused to exist with the monomers during the retention time. More specifically, when the polymerization initiator is caused to exist in the monomer-containing solution, the temperature of the solution is usually adjusted to 50° C. or less, preferably 40° C. or less in order to prevent decomposition of the polymerization initiator. When the polymerization initiator is not caused to exist in the monomer-containing solution, on the other hand, preparation or storage of the monomer-containing solution at higher temperatures is preferred because the solution contains the monomers at higher concentrations because of an improvement in the solubility of the monomers. When the solution is stored for long hours under heating, polymerization occurs at high temperature even in the presence of the polymerization inhibitive component so that the monomer-containing solution is preferably retained at 50° C. or less. The concentration of the monomers in the monomer-containing solution is usually selected from a range of from 5 to 100 wt. %, preferably from 10 to 60 wt. %, especially preferably form 15 to 50 wt. %.

Although no particular limitation is imposed on the polymerization reaction conditions, the reaction temperature usually ranges from about 60 to 100° C. and the polymerization time, which cannot be determined in a wholesale manner because it varies depending on the polymerization method, is from 1 to 24 hours after the temperature reaches the polymerization temperature, preferably from 2 to 12 hours in batch polymerization. In dropwise addition polymerization, a longer dropwise addition time is preferred, because the composition and concentration of the monomers and radical concentration in the polymerization system can be kept constant and thereby, the composition and molecular weight of the polymer thus generated during the dropwise addition become uniform. Too long dropwise addition time is however not preferred from the viewpoints of a production efficiency per hour and stability of the monomers in the solution to be added dropwise. Accordingly, the dropwise addition time is adjusted to fall within a range of from 0.5 to 20 hours, preferably from 1 to 10 hours. After completion of the dropwise addition, maturation is preferably conducted at a polymerization temperature maintained for a predetermined period in order to avoid remaining of unreacted monomers. The maturation time is within a range of 8 hours, preferably from 1 to 6 hours.

The polymerization reaction solution obtained by the polymerization reaction can be purified by a step of bringing the solution into contact with a poor solvent to cause precipitation (which will hereinafter be called "reprecipitation step") and removing a solution portion by filtration or the like method (which step will hereinafter be called "reprecipitation purification step"), and if necessary, a step of adding the resulting solid to a poor solvent or a mixture of the poor solvent and a good solvent to wash the solid therewith and removing a solution portion containing impurities such as unreacted monomers, oligomers, polymerization initiator, chain transfer agent and coupling reaction products thereof by filtration or the like method (which step will hereinafter be called "washing purification step"). After the solid thus obtained may be dried if necessary and re-dissolved in a solvent containing a good solvent, the reprecipitation purification step may be repeated again. Alternatively, after the solid may be dried if necessary, washing purification step with a poor solvent or a mixture of the poor solvent and good solvent may be repeated again.

As the good solvent used in each step, any solvent is usable without particular limitation insofar as it can dissolve therein, to say nothing of the copolymer, the unreacted monomers, oligomers, polymerization initiator, chain transfer agent and coupling reaction products thereof. Use of the above-described polymerization solvents is preferred in consideration of the management of the preparation steps. Any solvent is usable as a poor solvent without particular limitation insofar as it can cause precipitation of the copolymer. Examples include water; alcohols such as methanol and isopropanol; saturated hydrocarbons such as hexane and heptane; and mixtures thereof. In each step, the good solvent or poor solvent is used singly. In order to attain adequate solubility of the copolymer, monomer, oligomer, polymerization initiator, chain transfer agent and coupling reaction products thereof, a mixture of the good solvent and poor solvent can be used.

The kind and amount of the solvent in the reprecipitation purification step and washing purification step, and the number of repetitions of each purification step are preferably determined to suppress the concentration of the residual monomers to 1% or less, especially preferably 0.5% or less, more preferably 0.2% or less after consideration of the solubility of the copolymer and impurities at the preset temperature. In order to remove the impurities to give such a concentration, it is the common practice to carry out the reprecipitation purification step once, and washing purification step once or more, preferably twice or more.

After purification in such a manner, the copolymer can be obtained in the form of powder after drying, or in the form of a solution by charging, before or after drying, a good solvent to the purified copolymer to redissolve it in the solvent. As the good solvent used for re-dissolution, those listed above as the polymerization solvent can be used similarly. The solution after redissolution is preferably caused to pass through a filter having micropores with an average pore size of 0.5 µm or less, preferably 0.1 µm or less to remove solids, insoluble foreign matters or metals which are infinitesimally small.

The copolymer obtained by the preparation process of the present invention is useful as a film forming polymer for semiconductor lithography, because it contains a high molecular weight component having a molecular weight of 100,000 or greater (high polymer) in an amount as small as 0.1% or less in the molecular weight distribution as determined by gel permeation chromatography (GPC), is excellent in solubility in a solvent and storage stability, and makes it possible to minimize the generation of defects of resist patterns.

When the copolymer of the present invention is used as a film forming polymer for semiconductor lithography, a film forming solution can be prepared by feeding a solvent for film formation to a solution of the purified copolymer while distilling off another solvent, which has been used upon purification, under reduced pressure. As the solvent for film formation, any solvent can be used without particular limitation insofar as it can dissolve the copolymer therein. A proper solvent is usually selected in consideration of boiling point, influence on a semiconductor substrate or another coating film, and absorption of radiation used for lithography. Examples of the solvent used ordinarily for film formation include propylene glycol methyl ether acetate, ethyl lactate, propylene glycol monomethyl ether, methyl amyl ketone, γ-butyrolactone and cyclohexanone. Although no particular limitation is imposed on the amount of the solvent, it is usually added in an amount ranging from 1 to 20 parts by weight based on 1 part by weight of the copolymer.

When the copolymer is used as a resist polymer, a resist composition can be prepared by adding, to the film forming solution, a radiation-sensitive acid generator, and an acid diffusion inhibitor such as nitrogenous compound for preventing an acid from diffusing to a portion not exposed to radiation. As the radiation-sensitive acid generator, those ordinarily employed as a raw material for resist can be used, for example, onium salt compounds, sulfone compounds, sulfonate compounds, sulfonimide compounds, disulfonyldiazomethane compounds.

In addition, if necessary, compounds commonly used as an additive for resist such as a dissolution inhibitor, a sensitizer and dye can be added to the resist composition. Although no particular limitation is imposed on the composition ratio of each component (except the resist solvent) in the resist composition, it is usually selected from the following range: the polymer concentration is from 10 to 50 mass %, the radiation-sensitive acid generator concentration is from 0.1 to 10 mass %, and the acid diffusion inhibitor concentration is from 0.001 to 10 mass %.

When the copolymer thus obtained is used as an antireflective film, it is used either singly or in combination with a polyfunctional compound capable of crosslinking between polymers such as isocyanate, amine or epoxide.

EXAMPLES

Next, the present invention will be described in further detail by Examples. It should however be borne in mind that the present invention is not limited to or by them. In the examples, % which represents a concentration is on the basis of mass unless otherwise defined specifically except the content of high polymer (%: area percent). Determination of the amount of each of the polymerization inhibitor and dissolved oxygen in the monomer solution to be fed for the polymerization reaction, and the amount of a high polymer in the copolymer thus obtained, and evaluation of storage stability were performed in the following manners.

(1) Determination Method of the Amount of a Polymerization Inhibitor

The concentration of the polymerization inhibitor in the monomer solution was determined by HPLC. Analysis conditions and determination method are as described below.
Apparatus: "LC-10AD", product of Shimadzu Corporation
Detector: UV 254 nm
Column: "Inertsil ODS-3V", product of GL Science
Mobile phase: Acetonitrile/water=9/1 (volumetric ratio)
Sample: prepared by dissolving 0.1 g of a monomer solution in 1 ml of acetonitrile.
Determination: conducted in accordance with the internal standard method with bisphenol A as an internal standard substance.

(2) Determination Method of the Amount of Dissolved Oxygen

The amount of dissolved oxygen in the monomer solution was measured by a dissolved oxygen monitor. The measuring apparatus and measuring conditions are as described below.
Apparatus: "Model 3650" product of Orbisphere Laboratories
Measuring conditions: at 25 to 30° C., feeding rate: 50 ml/min (3) Determination Method of the Amount of High Polymer The amount of the high polymer in the copolymer was determined by GPC. Analysis conditions and determination method are as described below.
Apparatus: "GPC 8020", product of Tosoh Corporation
Detector: Differential refractive index (RI) detector
Column: "KF-804L" (3 columns), product of Showa Denko
Sample: prepared by sampling the polymer solution after completion of the polymerization and diluting it with tetrahydrofuran to give a polymer concentration of 1%.
Determination: To GPC, 15 µl of the above-described sample was poured, and a peak area $A_p$ of the target polymer was determined. Then, 150 µl of the sample was poured and a peak area $A_h$ of the high polymer was determined. Based on these results, the content (%) of the high polymer in the polymer was calculated in accordance with the following calculation formula (2):

$$\text{Content (\%) of high polymer} = \frac{A_h}{(A_p \times 10 + A_h)} \times 100 \quad (2)$$

(2) Evaluation Method of Storage Stability of Copolymer

A 15% propylene glycol methyl ether acetate solution (which will hereinafter be abbreviated as "PGMEA") of the copolymer was filtered through a 0.05 µm membrane filter and after storage at room temperature for 3 months, the number of liquid-borne particles was measured.
Apparatus: "KS-40B", product of Rion Co., Ltd.
Evaluation: The solution containing particles having a particle size of 0.2 µm or greater in an amount less than 100 particles/ml was evaluated as A, while the solution containing them in an amount of 1000 particles or greater/ml was evaluated as B.

Example 1

A monomer solution was prepared by charging 5,500 g of methyl ethyl ketone (which will hereinafter be abbreviated as "MEK"), 2,080 g of 5-acryloyloxy-2,6-norbornanecarbolactone (which will hereinafter be abbreviated as "NLA"), 2,480 g of 2-ethyl-2-adamantyl methacrylate (which will hereinafter be abbreviated as "EAM"), 80 g of azobisisobutyronitrile (which will hereinafter be abbreviated as "AIBN") as a polymerization initiator and 50 mg of 4-methoxyphenol (which will hereinafter be abbreviated as "MEHQ") as a polymerization inhibitor in a monomer-solution-preparing tank kept at a nitrogen atmosphere, and dissolving them. The resulting monomer solution was kept at from 25 to 30° C. As a result of determination, the amount of MEHQ in the monomer solution sampled was 27 mol ppm based on the monomers and 0.11 mol % mol ppm based on the monomers and 0.11 mol % based on the polymerization initiator. In addition, the determination revealed that the amount of dissolved oxygen in the monomer solution was 166 mol ppm based on the monomers. The measurement results of the amounts of the polymerization inhibitor and dissolved oxygen are shown in Table 1.

In a polymerization tank kept at a nitrogen atmosphere, 3,500 g of MEK was charged. After it was heated to 80° C. under stirring, the monomer solution was fed to the polymerization tank kept at 80° C. over 4 hours to cause polymerization. After completion of the feeding, the mixture was matured for 2 hours at a polymerization temperature kept at 80° C. The temperature was cooled to room temperature and the polymer solution was taken out. The polymer solution thus obtained was added dropwise to 70 kg of hydrous methanol to precipitate the polymer, followed by filtration. The wet cake thus obtained was washed with 70 kg of methanol, filtered and then re-dissolved in MEK. The solution was caused to pass through "Filter 40QSH" (product of Cuno K.K.). The solvent was then substituted by charging PGMEA while removing MEK by heating under reduced pressure, whereby a PGMEA solution containing 15% of the polymer was prepared. The composition, weight-average molecular weight (Mw), molecular weight distribution (Mw/Mn), and content of high polymer of the resulting polymer, and evaluation results of the storage stability of the PGMEA solution are shown in Table 2.

Example 2

A monomer solution was prepared by charging, in a monomer-solution-preparing tank kept at a nitrogen atmosphere, 9,000 g of MEK, 2,080 g of NLA, 2,480 g of EAM, 2,220 g of 3-hydroxy-1-adamantyl methacrylate (which will hereinafter be abbreviated as "HAM"), 110 g of AIBN as a polymerization initiator, and 100 mg of MEHQ as a polymerization inhibitor and dissolving them. The resulting monomer solution was kept at 25 to 30° C. The measurement results of the amounts of the polymerization inhibitor and dissolved oxygen in the monomer solution are shown collectively in Table 1.

In a polymerization tank kept at a nitrogen atmosphere, 5,000 g of MEK was charged. After it was heated to 80° C. under stirring, the monomer solution was fed to the polymerization tank kept at 80° C. over 4 hours to cause polymerization. After completion of the feeding, the resulting mixture was matured for 2 hours at a polymerization temperature kept at 80° C. After cooling to room temperature, the polymer solution was taken out. The polymer solution thus obtained was added dropwise to 100 kg of hydrous methanol to precipitate the polymer, followed by filtration. The wet cake thus obtained was washed with 100 kg of methanol, filtered and then re-dissolved in MEK. The solution was caused to pass through "Filter 40QSH" (product of Cuno K.K). The solvent was substituted by charging PGMEA while removing MEK by heating under reduced pressure, whereby a PGMEA solution containing 15% of the polymer was prepared. The composition, weight-average molecular weight (Mw), molecular weight distribution (Mw/Mn), and content of the high polymer of the resulting polymer, and evaluation results of the storage stability of the PGMEA solution are shown in Table 2.

Example 3

A monomer solution was prepared by charging, in a monomer-solution-preparing tank kept at a nitrogen atmosphere, 7,700 g of MEK, 2,220 g of 5-methacryloyloxy-2,6-norbornanecarbolactone (which will hereinafter be abbreviated as "NLM"), 2,480 g of EAM, 90 g of methacrylic acid (which will hereinafter be abbreviated as "MA"), 80 g of AIBN as a polymerization initiator, and 50 mg of MEHQ as a polymerization inhibitor and dissolving them. The resulting monomer solution was kept at 25 to 30° C. The measurement results of the amounts of the polymerization inhibitor and dissolved oxygen in the monomer solution are shown collectively in Table 1.

In a polymerization tank kept at a nitrogen atmosphere, 3,300 g of MEK was charged. After it was heated to 80° C. under stirring, the monomer solution was fed to the polymerization tank kept at 80° C. over 4 hours to cause polymerization. After completion of the feeding, the resulting mixture was matured for 2 hours at a polymerization temperature kept at 80° C. After cooling to room temperature and the polymer solution was taken out. The polymer solution thus obtained was added dropwise to 80 kg of hydrous methanol to precipitate the polymer, followed by filtration. The wet cake thus obtained was washed with 80 kg of methanol, filtered and then re-dissolved in MEK. The solution was caused to pass through "Filter 40QSH" (product of Cuno K.K.). The solvent was then substituted by charging PGMEA while removing MEK by heating under reduced pressure, whereby a PGMEA solution containing 15% of the polymer was prepared. The composition, weight-average molecular weight (Mw), molecular weight distribution (Mw/Mn), and content of the high polymer of the resulting polymer, and evaluation results of the storage stability of the PGMEA solution are shown in Table 2.

Example 4

In a similar manner to Example 1 except that the monomer-solution-preparing tank was kept under an air atmosphere and MEHA was not added, determination and evaluation were performed. The results are shown in Tables 1 and 2.

Example 5

In a similar manner to Example 1 except that the amount of MEHQ was changed to 5 g, the determination and evaluation were performed. The results are shown in Tables 1 and 2.

Comparative Examples 1 to 3

In a similar manner to Examples 1 to 3 except that MEHQ was not added, determination and evaluation were performed. The results are shown in Tables 1 and 2. The polymerization initiator (MEHQ) in an amount of several ppm order detected in Example 4 and Comparative Examples 1 to 3 in which no polymerization inhibitor was added is presumed to be a residue which has remained after the preparation procedure of the monomer employed in these examples.

TABLE 1

|  | Concentration of MEHQ | | Concentration of dissolved oxygen | |
| --- | --- | --- | --- | --- |
|  | Based on monomer (mol ppm) | Based on initiator (mol %) | Based on monomer (mol ppm) | Based on initiator (mol %) |
| Example 1 | 27 | 0.11 | 166 | 0.68 |
| Example 2 | 34 | 0.15 | 175 | 0.78 |
| Example 3 | 27 | 0.12 | 194 | 0.84 |
| Example 4 | 7 | 0.03 | 715 | 2.93 |
| Example 5 | 2,000 | 8.20 | 170 | 0.70 |
| Comp. Ex. 1 | 7 | 0.03 | 165 | 0.68 |
| Comp. Ex. 2 | 6 | 0.03 | 177 | 0.79 |
| Comp. Ex. 3 | 7 | 0.03 | 192 | 0.83 |

TABLE 2

|  | Analysis of composition by NMR (mol %) | | | | | GPC analysis | | High polymer | | Storage stability |
| --- | --- | --- | --- | --- | --- | --- | --- | --- | --- | --- |
|  | NLA | NLM | EAM | HAA | MA | Mw | Mw/Mn | Content % | Mw |  |
| Ex. 1 | 50 | — | 50 | — | — | 8,500 | 2.04 | Not detected | — | A |
| Ex. 2 | 34 | — | 33 | 33 | — | 10,600 | 1.95 | Not detected | — | A |
| Ex. 3 | — | 59 | 36 | — | 5 | 8,000 | 1.63 | Not detected | — | A |
| Ex. 4 | 50 | — | 50 | — | — | 8,500 | 2.05 | Not detected | — | A |
| Ex. 5 | 50 | — | 50 | — | — | 8,900 | 2.05 | Not detected | — | A |
| Comp. Ex. 1 | 50 | — | 50 | — | — | 8,400 | 2.05 | 0.33 | 249,000 | B |
| Comp. Ex. 2 | 33 | — | 33 | 34 | — | 10,400 | 1.95 | 0.58 | 281,000 | B |
| Comp. Ex. 3 | — | 59 | 36 | — | 5 | 7,900 | 1.63 | 0.26 | 257,000 | B |

As can be understood from these results, a high polymer was generated and growth of insoluble foreign matters was recognized during the storage term when a polymer was prepared without adding a polymerization inhibitor to monomers and at the same time, by keeping a monomer-solution-preparing tank under a nitrogen atmosphere. In the present invention, on the other hand, by incorporating, as a polymerization inhibitive component, at least a predetermined amount of a polymerization inhibitor or oxygen in a monomer-containing solution, a resist polymer free of a high polymer and excellent in storage stability can be obtained.

According to the present invention, provided are a preparation process of a copolymer for semiconductor lithography suited for use in a film forming composition such as a resist film forming composition for the formation of minute patterns necessary for semiconductor fabrication, a composition for forming the bottom film of a multilayer resist, or a composition for the formation of an antireflective film; and a copolymer available by the above-described process and containing no high polymer and therefore generating remarkably less defects in resist pattern when used for semiconductor lithography.

What is claimed is:

1. A process for preparing a copolymer for semiconductor lithography comprising the steps of
    A. conducting a radical polymerization of at least two monomers having an ethylenic double bond in a polymerization solvent in the presence of a polymerization initiator,
    B. adding at least one polymerization inhibiting component to the solution containing the monomers, said polymerization inhibitor comprising at least 20 mol ppm or greater based upon the monomers; and
    C. supplying oxygen to the solution containing the monomer in the amount of at least 400 mol ppm or greater based on the monomers.

2. The process for preparing a copolymer for semiconductor lithography defined claim 1, wherein the monomer-containing solution contains a polymerization initiator and the amount of the polymerization inhibitor added into the solution is 0.1 mol % or greater based on the polymerization initiator in the solution.

3. The process for preparing a copolymer for semiconductor lithography defined claim 1, wherein the polymerization inhibitor comprises at least one compound selected from the group consisting hydroquinone, benzoquinone, catechol, phenothiazine, N-nitrosophenylhydroxyamine, and 2,2,6,6-tetramethylpiperidin-1-oxyl free radical and derivatives thereof.

4. The process for preparing a copolymer for semiconductor lithography defined to claim 1, wherein the monomer-containing solution contains the polymerization initiator and the amount of oxygen added to the solution comprises 2 mol % or greater based on the polymerization initiator in the solution.

5. The process for preparing a copolymer for semiconductor lithography defined in claim 1, wherein the copolymer for semiconductor lithography is a copolymer available by the copolymerization comprises at least one selected from the group consisting of acrylate ester monomers and methacrylate ester monomers.

6. The process for preparing a copolymer for semiconductor lithography defined in claim 1, wherein the copolymer for semiconductor lithography has a structure in which solubility in an alkaline solution changes by the action of an acid.

7. The process for preparing a copolymer for semiconductor lithography defined in claim 1, wherein the copolymer for semiconductor lithography has an alicyclic structure.

8. The process for preparing a copolymer for semiconductor lithography defined in claim 7, wherein the alicyclic structure comprises at leats one selected from the group consisting cyclopentane ring, cyclohexane ring, isobornane ring, norbornane ring, adamantane ring, tricyclodecane ring and tetracyclododecane ring.

9. The process for preparing a copolymer for semiconductor lithography defined in claim 1, wherein the copolymer for semiconductor lithography has a lactone structure.

10. The process defined in claim 1, wherein the oxygen comprises pure oxygen.

11. The process defined in claim 1, wherein the copolymer produced by said process and having a high molecoular weight component of at least 100,000 comprises no more than 0.1 % by weight based upon the weight of the entire copolymer.

* * * * *